(12) United States Patent
Tanisako

(10) Patent No.: US 11,018,321 B2
(45) Date of Patent: May 25, 2021

(54) SEALING STRUCTURE AND LIGHT EMITTING DEVICE

(71) Applicant: PIONEER CORPORATION, Tokyo (JP)

(72) Inventor: Shinichi Tanisako, Tokyo (JP)

(73) Assignee: PIONEER CORPORATION, Kawasaki (JP)

( * ) Notice: Subject to any disclaimer, the term of this patent is extended or adjusted under 35 U.S.C. 154(b) by 0 days.

(21) Appl. No.: 16/795,508

(22) Filed: Feb. 19, 2020

(65) Prior Publication Data

US 2020/0185649 A1 Jun. 11, 2020

Related U.S. Application Data

(63) Continuation of application No. 16/083,463, filed as application No. PCT/JP2017/005288 on Feb. 14, 2017, now Pat. No. 10,608,205.

(30) Foreign Application Priority Data

Mar. 7, 2016 (JP) .............................. JP2016-043754

(51) Int. Cl.
*H01L 51/52* (2006.01)
*H01L 23/29* (2006.01)
(Continued)

(52) U.S. Cl.
CPC .......... *H01L 51/5256* (2013.01); *H01L 23/29* (2013.01); *H01L 23/31* (2013.01);
(Continued)

(58) Field of Classification Search
CPC ..... H01L 51/5256; H01L 51/50; H01L 23/31; H01L 23/29; H05B 33/04; H05B 33/52
See application file for complete search history.

(56) References Cited

U.S. PATENT DOCUMENTS 7,102,176 B2 * 9/2006 Kubota ............... H01L 51/5256
257/79
8,552,634 B2 * 10/2013 Kim .................... H01L 51/5271
313/504
(Continued)

FOREIGN PATENT DOCUMENTS

JP  2003-282241 A  10/2003
JP  2007-073504 A   3/2007
(Continued)

OTHER PUBLICATIONS

International Search Report for related International Application No. PCT/JP2017/005288, dated May 23, 2017; 2 pages.

*Primary Examiner* — Sitaramarao S Yechuri
(74) *Attorney, Agent, or Firm* — Procopio, Cory, Hargreaves & Savitch LLP

(57) ABSTRACT

A sealing structure (200) seals a light emitting unit (140) and includes a first inorganic film (210), a second inorganic film (220), a first resin-containing film (230), and a second resin-containing film (240). The film thickness of the first inorganic film (210) is equal to or greater than 1 nm and equal to or less than 300 nm. The first resin-containing film (230) is in contact with the first inorganic film (210) and includes a first resin. The second inorganic film (220) is positioned on an opposite side of the first inorganic film (210) with the first resin-containing film (230) interposed between the first and second inorganic films. The second resin-containing film (240) is positioned between the first resin-containing film (230) and the second inorganic film (220) and is in contact with the second inorganic film (220). The second resin-containing film (240) includes a second resin.

10 Claims, 11 Drawing Sheets

(51) Int. Cl.
  *H01L 23/31* (2006.01)
  *H05B 33/04* (2006.01)
  *H01L 33/52* (2010.01)
  *H01L 33/56* (2010.01)

(52) U.S. Cl.
  CPC ............ *H01L 33/52* (2013.01); *H05B 33/04* (2013.01); *H01L 33/56* (2013.01)

(56) References Cited

U.S. PATENT DOCUMENTS

| | | | |
|---|---|---|---|
| 9,093,666 B2* | 7/2015 | Young | H01L 51/5246 |
| 2003/0209708 A1* | 11/2003 | Kubota | H01L 51/5256 257/40 |
| 2006/0270213 A1* | 11/2006 | Kubota | H01L 51/5256 438/623 |
| 2009/0141230 A1* | 6/2009 | Inoue | C04B 41/009 349/158 |
| 2010/0181903 A1* | 7/2010 | Kim | H01L 51/5271 313/504 |
| 2010/0244073 A1* | 9/2010 | Ito | H01L 51/5246 257/98 |
| 2011/0140164 A1* | 6/2011 | Seo | H01L 51/5256 257/100 |
| 2011/0186340 A1* | 8/2011 | Kuramoto | H01L 24/83 174/260 |
| 2012/0228617 A1* | 9/2012 | Ko | H01L 51/529 257/59 |
| 2013/0207083 A1* | 8/2013 | Young | H01L 51/5246 257/40 |
| 2014/0021856 A1* | 1/2014 | Jung | H01L 51/5253 313/504 |
| 2014/0027739 A1* | 1/2014 | van de Weijer | H01L 51/5259 257/40 |
| 2015/0130030 A1* | 5/2015 | Ma | H01L 25/0652 257/621 |
| 2018/0183006 A1* | 6/2018 | Ishida | H01L 51/5246 |
| 2018/0208804 A1* | 7/2018 | Mieda | C09J 163/00 |

FOREIGN PATENT DOCUMENTS

| | | |
|---|---|---|
| JP | 2009-037809 A | 2/2009 |
| JP | 2010-160906 A | 7/2010 |
| JP | 2010-171012 A | 8/2010 |
| JP | 2012-069507 A | 4/2012 |
| JP | 2013-527570 A | 6/2013 |
| JP | 2014-500582 A | 1/2014 |
| JP | 2014-167893 A | 9/2014 |
| JP | 2014-225380 A | 12/2014 |
| WO | 2017-033879 A1 | 3/2017 |

* cited by examiner

SEALING STRUCTURE AND LIGHT EMITTING DEVICE

This application is a continuation of application Ser. No. 16/083,463 filed Sep. 7, 2018, which is a National Stage Entry of International Application No. PCT/JP2017/005288 filed on Feb. 14, 2017, which claims priority to Japanese patent application No. 2016-043754, filed Mar. 7, 2016, the disclosures of which are incorporated herein by reference in their entirety.

TECHNICAL FIELD

The present invention relates to a sealing structure and a light emitting device.

BACKGROUND ART

An organic EL element is provided as one of light sources of light emitting devices such as lighting devices or display devices. The organic EL element has a configuration in which an organic layer is disposed between a first electrode and a second electrode. The organic layer is weak against oxygen or water. Thus, sealing the organic EL element is required.

Patent Document 1 discloses using a structure in which a first inorganic barrier film, a first polymer compound film, a second inorganic barrier film, and a second polymer compound film are stacked in this order as a sealing structure for sealing an organic EL element. The polymer compound film is formed to fill pinholes in the inorganic barrier film positioned under the polymer compound film. In Patent Document 1, the polymer compound film is formed by using a plasma polymerization method.

Patent Document 2 discloses sealing a display unit by alternately stacking a first sealing layer containing an inorganic matter and a second sealing layer containing an organic matter on the display unit.

RELATED DOCUMENT

Patent Document

[Patent Document 1] Japanese Laid-open Patent Application Publication No. 2003-282241
[Patent Document 2] Japanese Laid-open Patent Application Publication No. 2010-171012

SUMMARY OF THE INVENTION

Technical Problem

In a case of using an inorganic film for sealing an object to be sealed such as an organic EL element, as disclosed in Patent Document 1, defects such as pinholes may occur in the inorganic film. The defect is removed by forming, on the inorganic film, a film composed of another material, for example, as disclosed in Patent Document 1. However, if the sealing film is set to have a multilayer structure, stress may be generated in the multilayer structure.

An exemplary problem to be solved of the present, invention is to remove a defect occurring in an inorganic film and to reduce stress generated in a sealing structure, in a case where the inorganic film is used in the sealing structure that seals an object to be sealed.

Solution to Problem

In one embodiment, there is provided a sealing structure that seals an object to be sealed, which includes a first inorganic film having a film thickness which is equal to or greater than 1 nm and equal, to or less than 300 nm, a first resin-containing film which is in contact with the first inorganic film and includes a first resin, a second inorganic film which is positioned on an opposite side of the first inorganic film with the first resin-containing film interposed between the first and second inorganic films, and a second resin-containing film which is positioned between the first resin-containing film and the second inorganic film, is in contact with the second inorganic film, and includes a second resin.

In another embodiment, there is provided a light emitting device which includes a light emitting unit including an organic layer and a sealing structure that seals the light emitting unit. The sealing structure is the above-described sealing structure.

BRIEF DESCRIPTION OF THE DRAWINGS

The above-described object, other objects, features, and advantages will become more apparent from the following description of the preferred embodiment and the accompanying drawings.

DESCRIPTION OF EMBODIMENTS

Hereinafter, an embodiment of the present invention will be described with reference to the drawings. In all the drawings, the same components are denoted by the same reference signs and descriptions thereof will not be repeated.

Embodiment

Figure 1:
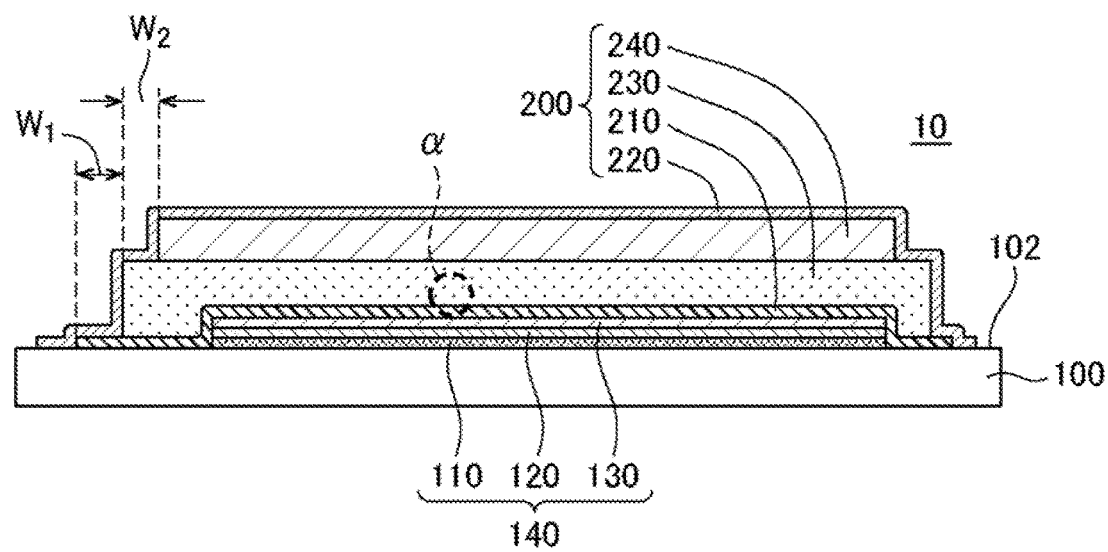
FIG. 1 is a sectional view illustrating a configuration of a light emitting device according to an embodiment.

FIG. 1 is a sectional view illustrating a configuration of a light emitting device 10 according to an embodiment. The light emitting device 10 according to the embodiment includes a light emitting unit 140 and a sealing structure 200. The light emitting unit 140 (an example of an object to be sealed) includes an organic layer 120. The sealing structure 200 seals the light emitting unit 140, and includes a first inorganic film 210, a second inorganic film 220, a first resin-containing film 230, and a second resin-containing film 240. The film thickness of the first inorganic film 210 is equal to or greater than 1 nm and equal to or less than 300 nm. The first resin-containing film 230 is in contact with the first inorganic film 210 and includes a first resin. The second inorganic film 220 is positioned on an opposite side of the first inorganic film 210 with the first resign-containing film 230 interposed between the first and second inorganic films. The second resin-containing film 240 is positioned between the first, resin-containing film 230 and the second inorganic film 220 and is in contact with the second inorganic film 220. The second resin-containing film 240 includes a second resin. Details thereof will be described below.

The light emitting device 10 is, for example, a lighting device or a display. In the example illustrated in FIG. 1, the light emitting unit 140 of the light emitting device 10 is a bottom emission type light emitting unit. Light emitted from the light emitting unit 140 is emitted to the outside of the light emitting device 10 through a substrate 100. However, the light emitting unit 140 may emit light in an opposite direction of the substrate 100 (top emission type) or may be a dual emission type light emitting device.

In a case where the light emitting unit 140 is a bottom emission type, the substrate 100 is formed of a light-transmitting material such as glass or a light-transmitting resin, for example. A surface of the substrate 100 on an opposite side of a first electrode 110 serves as a light emitting surface of the light emitting device 10. The substrate 100 is, for example, a polygon such as a rectangle. The substrate 100 may have flexibility. In a case where the substrate 100 has flexibility, the thickness of the substrate 100 is equal to or greater than 10 μm and equal to or less than 1000 μm, for example. In particular, in a case where the substrate 100 has flexibility by using a glass material, the thickness of the substrate 100 is equal to or less than 200 μm, for example. In a case where the substrate 100 has flexibility by using a resin material, the substrate is formed by a material including polyethylene naphthalate (PEN), polyethersulfone (PES), polyethylene terephthalate (PET), or polyimide, as an example of the substrate 100. In a case where the substrate 100 includes a resin material, an inorganic barrier film of SiNx, SiON, or the like is formed on at least a light emitting surface (preferably, both surfaces) of the substrate 100 in order to suppress permeation of moisture through the substrate 100.

In a case where the light emitting unit 140 is a top emission type, the substrate 100 may not have light transmittance.

The light emitting unit 140 is formed on a first surface 102 of the substrate 100 and includes a first electrode 110, an organic layer 120, and a second electrode 130.

At least one of the first electrode 110 and the second electrode 130 is a transparent electrode having optical transparency. For example, in a case where the light emitting unit 140 is the bottom emission type, the first electrode 110 is a transparent electrode. In a case where the light emitting unit 140 is the top emission type, the second electrode 130 is a transparent electrode. In a case where the light emitting unit 140 is a dual emission type, both of the first electrode 110 and the second electrode 130 are transparent electrodes.

A transparent conductive material constituting the transparent electrode (for example, first electrode 110 illustrated in FIG. 1) is a material including metal, for example, a metal compound such as indium tin oxide (ITO), indium zinc oxide (IZO), indium tungsten zinc oxide (IWZO), and zinc oxide (ZnO). The refractive index of the material of the transparent electrode is, for example, equal to or greater than 1.5 and equal to or less than 2.2. The thickness of the transparent electrode is, for example, equal to or greater than 10 nm and equal to or less than 500 nm. The transparent electrode is formed by, for example, using a sputtering method or a vapor deposition method. The transparent electrode may be a carbon nanotube or a conductive organic material such as PEDOT or PSS and may be a thin metal electrode.

An electrode (second electrode 130 in the example illustrated in FIG. 1) which does not have light transmittance among the first electrode 110 and the second electrode 130 includes, for example, a metal layer formed of metal, selected from the first group consisting of Al, Au, Ag, Pt, Mg, Sn, Zn, and In, or an alloy of the metal selected from the first group. This electrode is formed by, for example, using a sputtering method or a vapor deposition method.

The organic layer 120 is positioned between the first electrode 110 and the second electrode 130 and includes a hole injection layer, a hole transport layer, a light emitting layer, an electron transport layer, and an electron injection layer. However, one of the hole injection layer and the hole transport layer may not be formed. One of the electron transport layer and the electron injection layer may not be formed. The organic layer 120 may further include other layers.

The light emitting device 10 includes the sealing structure 200. The sealing structure 200 has a stacked structure in which a plurality of films is stacked. The light emitting unit 140 is sealed between the substrate 100 and the sealing structure 200.

In the example illustrated in FIG. 1, the sealing structure 200 includes the first inorganic film 210, the second inorganic film 220, the first resin-containing film 230, and the second resin-containing film 240. In a thickness direction, the first inorganic film 210 is positioned to be closer to the light emitting unit 140 (a lower side in FIG. 1) than the second inorganic film 220.

The first inorganic film 210 is formed by, for example, an inorganic material such as aluminum oxide and titanium oxide. The thickness of the first inorganic film 210 is preferably equal to or less than 300 nm. The thickness of the first inorganic film 210 is, for example, equal to or greater than 1 nm. The same applies to the second inorganic film 220.

The first inorganic film 210 is formed by, for example, using an atomic layer deposition (ALD) method. In this case, the first inorganic film 210 is formed along the surface of the light emitting unit 140. Thus, an unevenness formed by the presence and absence of the light emitting unit 140 remains on the surface of the substrate 100, in a state where the first inorganic film 210 has been formed.

The first inorganic film 210 may have a multilayer structure in which a plurality of layers is stacked. In this case, the first inorganic film 210 may have a configuration in which a plurality of layers formed of the same material (for example, aluminum oxide) Is stacked. The first inorganic film 210 may have a structure in which a first sealing layer formed of a first material (for example, aluminum oxide) and a second sealing layer formed of a second material (for example, titanium oxide) are alternately stacked. The bottommost layer may be any of the first sealing layer and the second sealing layer. The topmost layer may be any of the first sealing layer and the second sealing layer. The first inorganic film 210 may be a single layer in which the first material and the second material are mixed. The same applies to the second inorganic film 220.

The first inorganic film 210 may be formed by using another film forming method, for example, a CVD method or a sputtering method. In this case, the first inorganic film 210 is formed of SiO2, SiN, or the like. The film thickness of the first inorganic film is, for example, equal to or greater than 100 nm and equal to or less than 300 nm. In a case where the first inorganic film 210 is formed by using an ALD method, the film thickness of the first inorganic film 210 becomes thin, and light transmittance of the first inorganic film 210 increases. Therefore, in a case where the light emitting device 10 is desired to have light transmittance or a case where light of the light emitting device 10 is extracted from the sealing structure 200 side, the first inorganic film 210 is preferably formed by using an ALD method.

The second inorganic film 220 may have the same structure as that of the first inorganic film 210 or may have a different structure. The material constituting the second inorganic film 220 may be the same as or different from the material constituting the first inorganic film 210. When the second inorganic film 220 is formed of the same material as that of the first inorganic film 210, it is possible to reduce the manufacturing cost of the sealing structure 200. In a case where the second inorganic film 220 is formed by using a CVD method or a sputtering method, the film thickness of the second inorganic film is equal to or greater than 100 nm and equal to or less than 1000 nm. In a case where the second inorganic film 220 is manufactured by an ALD method, the film thickness thereof is equal to or greater than 1 nm and equal to or less than 300 nm.

In a case where the first inorganic film 210 and the second inorganic film 220 are formed by a gas phase method such as an ALD method or a CVD method, a terminal (not illustrated) of the light emitting unit 140 is also covered by the first inorganic film 210 and the second inorganic film 220. Thus, it is necessary that a portion of the first inorganic film 210 and the second inorganic film 220, which covers the terminal is removed by, for example, using a lift-off method.

Each of the first resin-containing film 230 and the second resin-containing film 240 is positioned between the first inorganic film 210 and the second inorganic film 220. When viewed from a direction which is perpendicular to the substrate 100, at least a portion (for example, the entire circumference of an edge) of the first inorganic film 210 protrudes from the first resin-containing film 230 and the second resin-containing film 240 and overlaps neither first resin-containing film nor the second resin-containing film. At least a portion (for example, the entire circumference of an edge) of the second inorganic film 220 protrudes from the first resin-containing film 230 and the second resin-containing film 240 and overlaps neither the first resin-containing film nor the second resin-containing film. At least a portion of a portion of the first inorganic film 210, which overlaps neither the first resin-containing film 230 nor the second resin-containing film 240 is in contact with the second inorganic film 220. For example, the entire circumference of an edge of the upper surface of the first inorganic film 210 is in contact with the entire circumference of an edge of the lower surface of the second inorganic film 220. In a section perpendicular to the substrate 100, a width W1 of a portion of the first inorganic film 210, which is in contact with the second inorganic film 220 is, for example, equal to or greater than 1 mm and equal to or less than 5 mm. With this configuration, a possibility of the first resin-containing film 230 and the second resin-containing film 240 being exposed to the air is reduced. In other words, the first resin-containing film 230 and the second resin-containing film 240 do not have a portion in contact with the air (opened portion). Thus, even when the sealing structure 200 includes the first resin-containing film 230 and the second resin-containing film 240 having a higher rate of being deteriorated due to moisture than that of the inorganic film, sealing performance of the sealing structure 200 is hardly reduced.

Figure 2:
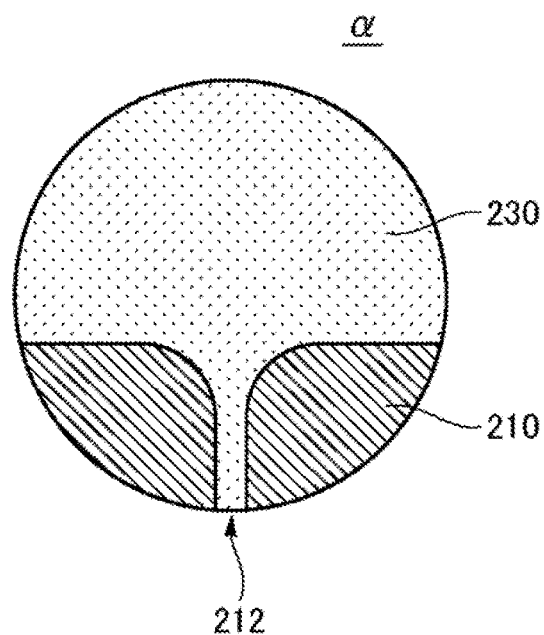
FIG. 2 is an enlarged view illustrating a region surrounded by a dotted line α in FIG. 1.

The first resin-containing film 230 is formed by, for example, using the first resin. The glass transition point of the first resin is lower than a heat treatment temperature (for example, temperature when the first resin is thermally hardened) in a manufacture process of the light emitting device 10. Therefore, the first resin-containing film 230 is softened and has fluidity, in a heat treatment process of the manufacture process of the light emitting device 10. As illustrated in the enlarged view in FIG. 2, when a defect such as a hole 212 or a recessed portion is formed in the first inorganic film 210, the defect is buried by the softened first resin-containing film 230. The first resin is, for example, a thermosetting resin such as an epoxy resin and an acrylic resin. However, the first resin may be another resin having a glass transition point which satisfies the above condition.

The thickness of the first resin-containing film 230 is, for example, equal to or greater than 1 μm and equal to or less than 30 μm. The first resin-containing film 230 is thicker than the first inorganic film 210. Therefore, the first resin-containing film 230 buries the unevenness formed by the presence and absence of the light emitting unit 140, and thus flattens the surface of the substrate 100. The first resin-containing film 230 is formed by, for example, using a coating method such as a printing method, an ink jet method, a dispensing method, and a coater method.

Here, the thickness of the first inorganic film 210 which is a layer in contact with the first resin-containing film 230 is equal to or greater than 1 nm and equal to or less than 300 nm and is thinner than that of the first resin-containing film 230. Therefore, in order to relieve stress on such a thin first inorganic film 210, the film thickness of the first resin-containing film 230 is preferably equal to or greater than 1 μm and equal to or less than 5 μm. In order to set the film thickness of the first resin-containing film 230 to be in the above range, for example, the first resin-containing film 230 may be formed by using an ink jet method.

The second resin-containing film 240 is formed by, for example, using the second resin. The first resin has properties different from those of the second resin. The Young's modulus of the second resin is lower than the Young's modulus of the first resin. In other words, the second resin-containing film 240 is formed by using a material which deforms easier than that of the first resin-containing film 230. With this configuration, when stress is applied to the light emitting device 10, the stress is absorbed by the second resin-containing film 240. Thus, it is possible to suppress cracking of the second inorganic film 220.

The glass transition point of the second resin is higher than a heat treatment temperature (for example, temperature at which the second resin is thermally hardened) in the manufacture process of the light emitting device 10. The glass transition point of the second resin is higher than the glass transition point of the first resin. Even though the first resin-containing film 230 is softened and has fluidity in the manufacture process of the light emitting device 10, the second resin-containing film 240 is not softened and does not flow. Therefore, it is possible to suppress cracking of the second inorganic film 220 occurring by softening of the second resin-containing film 240 in the manufacture process of the light emitting device 10. The second resin is, for example, a thermosetting resin such as an epoxy resin and an acrylic resin. The second resin may be another resin having a glass transition point which satisfies the above condition.

The glass transition point of the first resin-containing film 230 is, for example, equal to or higher than 80° C. and equal to or lower than 100° C. The glass transition point of the second resin-containing film 240 is, for example, equal to or higher than 100° C. and equal to or lower than 120° C.

The thickness of the second resin-containing film 240 is, for example, equal to or greater than 1 μm and equal to or less than 30 μm. The second resin-containing film 240 is formed by, for example, using a coating method such as a printing method, an ink jet method, a dispensing method, and a coater method.

Here, in a case where the second inorganic film 220 in contact with the second resin-containing film 240 is formed by an ALD method and the thickness thereof is equal to or greater than 1 nm and equal to or less than 300 nm, that is, the second inorganic film is a thin film, the thickness of the second resin-containing film 240 is preferably equal to or greater than 1 μm and equal to or less than 5 μm. By setting the thickness of the second resin-containing film 240 to equal to or less than 5 μm, it is possible to relieve stress which occurs by the second resin-containing film 240 and is applied to the second inorganic film 220, and to prevent an occurrence of cracks (cracks or defects) in the second inorganic film 220. If the thickness of the second resin-containing film 240 is set to be less than 1 μm, a portion at which the second resin-containing film 240 is not formed occurs due to uneven coating, a pinhole is formed in the second resin-containing film 240, or the second resin-containing film 240 cannot coat all foreign matter. In order to form the second resin-containing film 240 to have a thickness which is equal to or greater than 1 μm and equal to or less than 5 μm, for example, the second resin-containing film 240 may be formed by an ink jet method.

As described above, if the first inorganic film 210 and the second inorganic film 220 are set to be thin films having a thickness which is equal to or greater than 1 nm and equal to or less than 300 nm, and the first resin-containing film 230 and the second resin-containing film 240 are set to have a thickness which is equal to or greater than 1 μm and equal to or less than 5 μm, it is possible to prevent the occurrence of cracks in the first inorganic film 210 and the second inorganic film 220. In a case where each of the first resin-containing film 230 and the second resin-containing film 240 is formed to be thin and to have a thickness which is equal to or greater than 1 μm and equal to or less than 5 μm, uneven coating or a pinhole occurs or a problem in covering (fixing) property of foreign matter occurs. However, it is possible to solve the above problems by including both (two layers) of the first resin-containing film 230 and the second resin-containing film 240. When viewed from a direction which is perpendicular to the substrate 100, the second resin-containing film 240 has an area smaller than that of the first resin-containing film 230. This is so that a portion of the first resin-containing film 230 protrudes from the second resin-containing film 240 and the portion is prevented from being covered by the second resin-containing film 240. The second inorganic film 220 is in contact with the upper surface of a portion of the first resin-containing film 230, which is not covered by the second resin-containing film 240. With such a configuration, it is possible to make steps of the second inorganic film 220 at the end portions of the first resin-containing film 230 and the second resin-containing film 240 to become smooth. In addition, it is possible to prevent an occurrence of defects in the second inorganic film 220 and to improve coatability. In the section perpendicular to the substrate 100, a width W2 of a portion of the first resin-containing film 230, which is in contact with the second inorganic film 220 is, for example, equal to or greater than 1 mm and equal to or less than 5 mm.

The light emitting device 10 may further include a resin layer on the sealing structure 200. The resin layer is provided for protecting the sealing structure 200 and is formed by, for example, using an acrylic resin or an epoxy resin.

Next, a manufacturing method of the light emitting device 10 will be described. First, the first electrode 110, the organic layer 120, and the second electrode 130 are formed on the substrate 100. Thus, the light emitting unit 140 is formed on the substrate 100. The first inorganic film 210 is formed over the surface of the substrate 100, on which the light emitting unit 140 is formed.

Then, coating with a resin (first resin) to serve as the first resin-containing film 230 is performed. The resin is subjected to heat treatment at a temperature which is equal to or higher than a thermosetting temperature of the first resin. Thus, the first resin is hardened, and thereby the first resin-containing film 230 is formed. At this time, since the glass transition point of the first resin is lower than the thermosetting temperature of the first resin, the hole 212 or the recessed portion of the first inorganic film 210 is buried by the first resin-containing film 230.

Then, a resin to serve as the second resin-containing film 240 is coated onto the first resin-containing film 230. The resin is subjected to heat treatment at a temperature which is equal to or higher than the thermosetting temperature of the second resin-containing film 240. Thus, the second resin is hardened, and thereby the second resin-containing film 240 is formed. At this time, in a case where the glass transition point of the first resin is lower than the thermosetting temperature of the second resin, the first resin-containing film 230 is softened and flows. At this time, the hole 212 of the first inorganic film 210 is sufficiently filled with a portion of the first resin-containing film 230.

Then, the second inorganic film 220 is formed on the second resin-containing film 240. At this time, the glass transition temperature of the second resin-containing film 240 is higher than the glass transition temperature of the first resin-containing film 230. Therefore, a possibility that a temperature applied to the second resin-containing film 240 when the second inorganic film 220 is formed is higher than the glass transition temperature of the second resin-containing film 240 is low. Thus, it is possible to suppress an occurrence of a film formation defect in the second inorganic film 220 by softening of the second resin-containing film 240 when the second inorganic film 220 is formed.

Thermosetting of the first resin-containing film 230 and thermosetting of the second resin-containing film 240 may be performed in the same heat treatment process. The heat treatment temperature in this case is higher than any of the thermosetting temperature of the first resin-containing film 230 and the thermosetting temperature of the second resin-containing film 240. However, the heat treatment temperature is preferably lower than the glass transition temperature of the second resin-containing film 240.

As described above, according to the present embodiment, the first resin-containing film 230 and the second resin-containing film 240 are formed between the first inorganic film 210 and the second inorganic film 220. The resin (first resin) included in the first resin-containing film 230 is different from the resin (second resin) constituting the second resin-containing film 240. Thus, the first resin-containing film 230 has properties different from those of the second resin-containing film 240. Thus, it is possible to bury (remove) defects occurring in the first inorganic film 210 of the sealing structure 200, by the first resin-containing film 230. In addition, it is possible to reduce stress generated in the sealing structure 200.

For example, in a case where the glass transition temperature of the second resin-containing film 240 is higher than the glass transition temperature of the first resin-containing film 230, the first resin-containing film 230 is easily softened when being heated. Thus, it is possible to reduce stress generated in the sealing structure 200. At this time, the second resin-containing film 240 is hardly softened when being heated. Thus, the second inorganic film 220 is supported by the second resin-containing film 240. Therefore, cracks hardly occur in the second inorganic film 220 even in a case where the first resin-containing film 230 is softened.

A possibility that the temperature applied to the second resin-containing film 240 when the second inorganic film 220 is formed is higher than the glass transition temperature of the second resin-containing film 240 is reduced. Thus, it is possible to suppress an occurrence of a film formation defect in the second inorganic film 220 by softening the second resin-containing film 240 when the second inorganic film 220 is formed.

Since the Young's modulus of the second resin is lower than the Young's modulus of the first resin, the second resin-containing film 240 deforms easier than the first resin-containing film 230. Therefore, when stress is applied to the light emitting device 10, the stress is absorbed by the second resin-containing film 240. Thus, it is possible to suppress cracking of the second inorganic film 220.

MODIFICATION EXAMPLE

Figure 12:
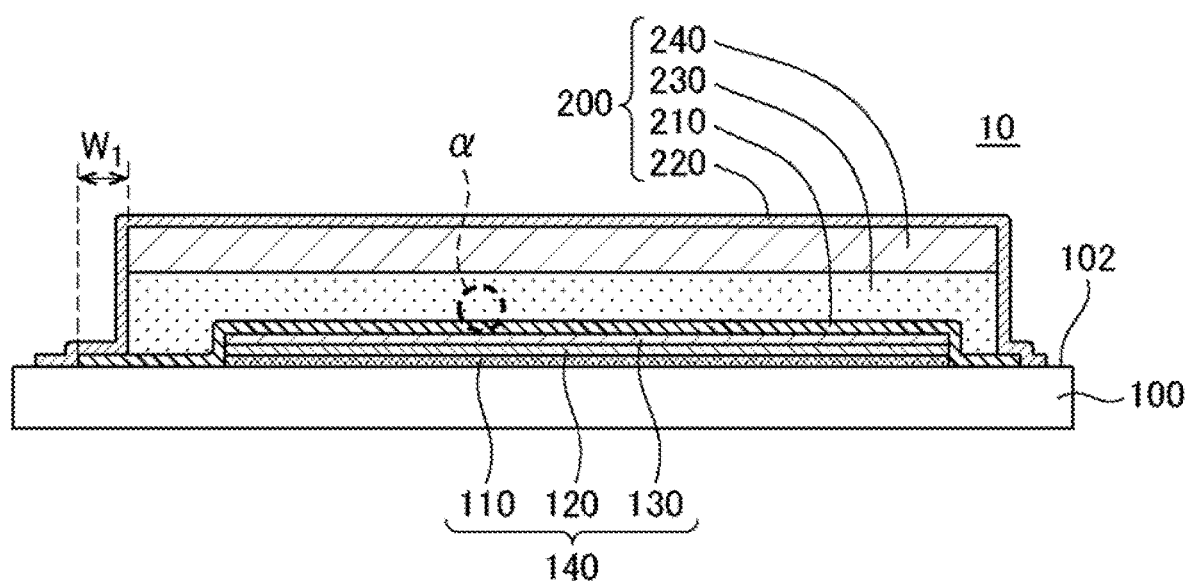
FIG. 12 is a sectional view illustrating a configuration of a light emitting device according to a modification example.

FIG. 12 is a sectional view illustrating a configuration of a light emitting device 10 according to a modification example. FIG. 12 corresponds to FIG. 1 in the embodiment. The light emitting device 10 according to the modification example has the same configuration as that of the light emitting device 10 according to the embodiment, except for the structure of the first resin-containing film 230 and the second resin-containing film 240.

In the present modification example, the first resin-containing film 230 and the second resin-containing film 240 are previously formed in a form of one film obtained by stacking the first resin-containing film and the second resin-containing film. The film is not thermally hardened since no polymerization reaction has occurred in any of the first resin-containing film 230 and the second resin-containing film 240. The first resin-containing film 230 and the second resin-containing film 240 are formed in a manner that the one film is cut out to have a width of the light emitting unit 140, and the cutout film is attached onto the light emitting unit 140, and then is heated. Therefore, the end surface of the first resin-containing film 230 forms one continuous surface along with the end surface of the second resin-containing film 240 and overlaps the end surface of the second resin-containing film. In the example illustrated in FIG. 12, the end surface is a flat surface which is substantially perpendicular to the substrate 100. However, the end surface may be a surface other than a flat surface, for example, a surface having at least a curved portion.

In the present modification example, similar to the embodiment, it is also possible to bury defects occurring in the first inorganic film 210 of the sealing structure 200 by the first resin-containing film 230. In addition, it is possible to reduce stress generated in the sealing structure 200. Further, since the first resin-containing film 230 and the second resin-containing film 240 are previously formed as one film, it is possible to reduce the manufacturing cost of the first resin-containing film 230 and the second resin-containing film 240.

Example 1

Figure 3:
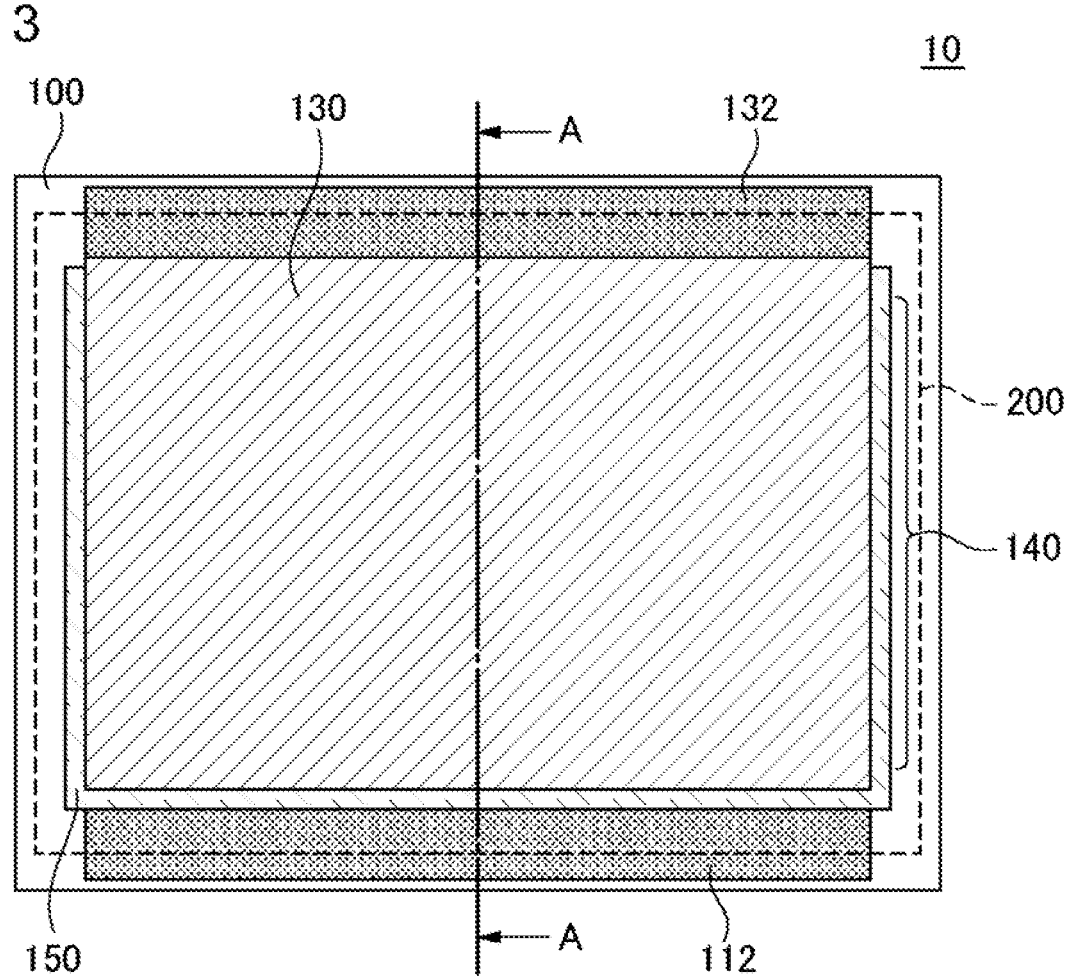
FIG. 3 is a plan view illustrating a light emitting device according to Example 1.
Figure 4:
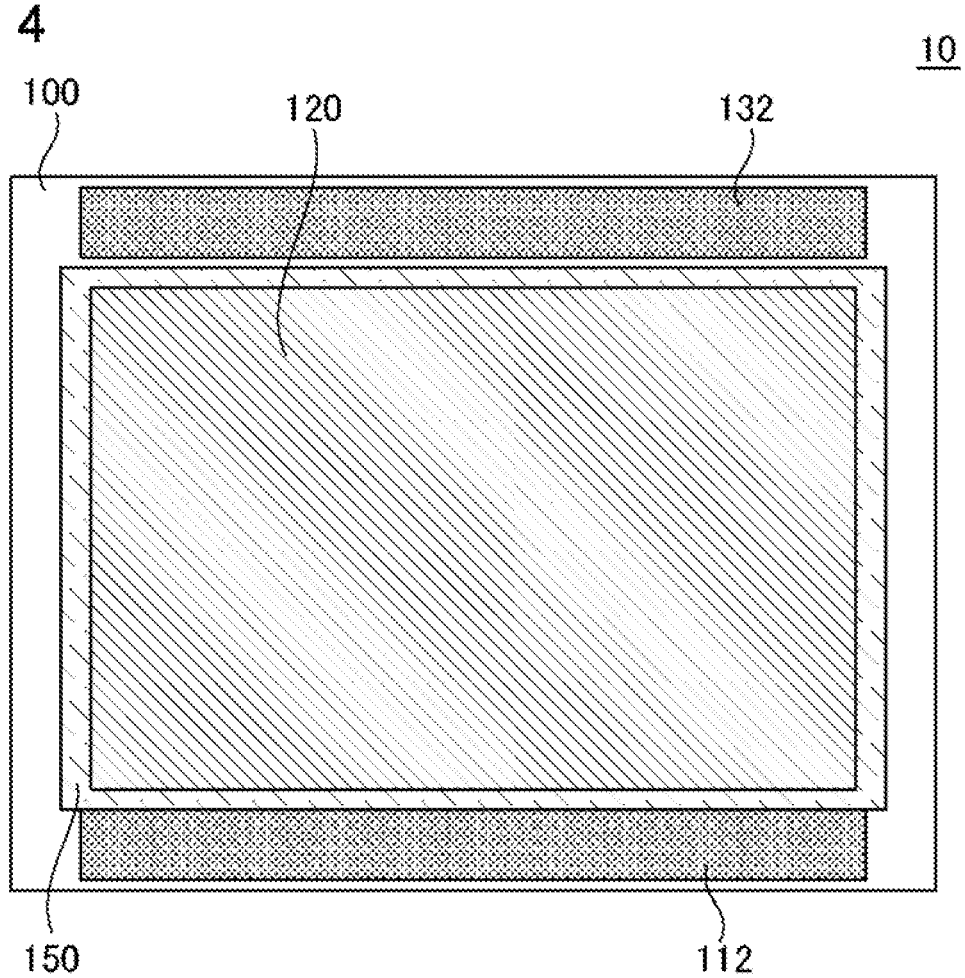
FIG. 4 is a view in which a second electrode is removed from FIG. 3.
Figure 5:
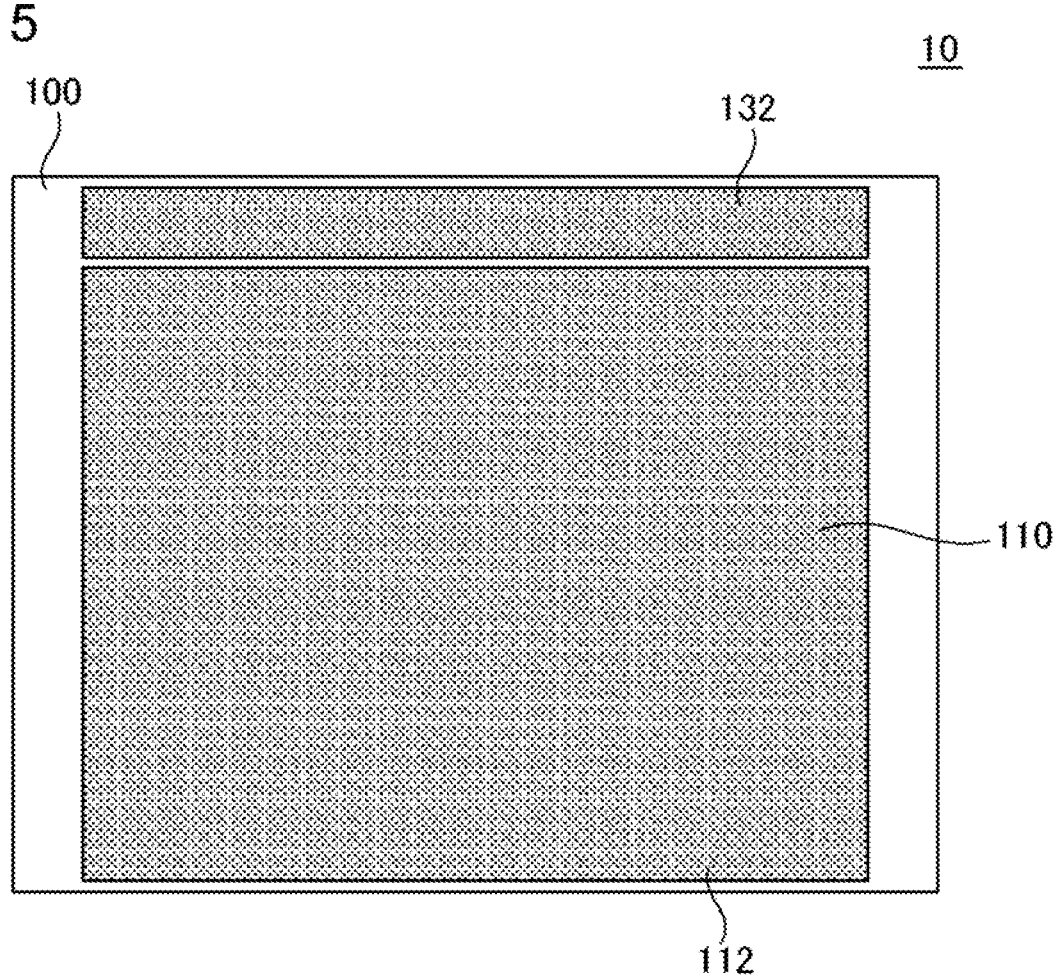
FIG. 5 is a view in which an organic layer and an insulating layer are removed from FIG. 4.
Figure 6:
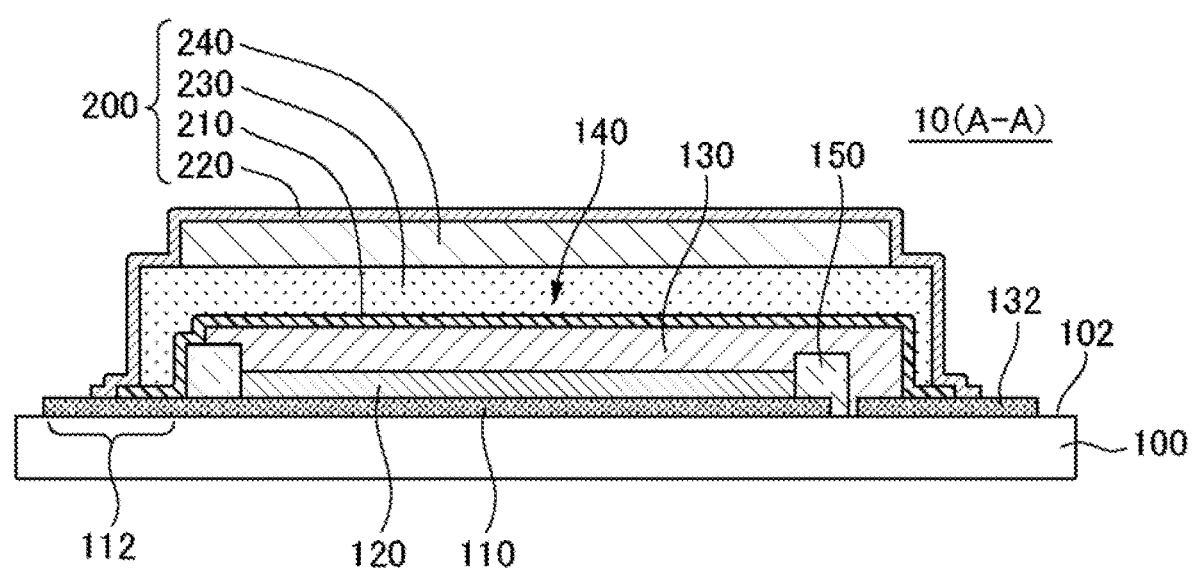
FIG. 6 is a sectional view taken along line A-A in FIG. 3.

FIG. 3 is a plan view illustrating the light emitting device 10 according to Example 1. FIG. 4 is a view in which the second electrode 130 is removed from FIG. 3. FIG. 5 is a view in which the organic layer 120 and an insulating layer 150 are removed from FIG. 4. FIG. 6 is a sectional view taken along line A-A in FIG. 3. The light emitting device 10 according to Example 1 is a lighting device. The light emitting unit 140 is formed on substantially the entire surface of the substrate 100.

In detail, the first electrode 110, a first terminal 112, and a second terminal 132 are formed on the first surface 102 of the substrate 100. The first terminal 112 and the second terminal 132 have a layer formed by using the same material as that of the first electrode 110. This layer is formed in a process which is the same as that for the first, electrode 110. The layer of the first terminal 112, which is formed by the same material as that of the first electrode 110 is integrated with the first electrode 110. Meanwhile, the second terminal 132 is separated from the first, electrode 110.

The first terminal 112 and the second terminal 132 are positioned on sides which are opposite to each other with the first electrode 110 interposed between the first terminal and the second terminal. In the example illustrated in FIGS. 3 to 6, the substrate 100 is rectangular. The first terminal 112 is formed along one side of the substrate 100. The second terminal 132 is formed along a side on an opposite side of the first terminal 112 among four sides of the substrate 100. However, the layout of the first terminal 112 and the second terminal 132 is not limited to the example illustrated in FIGS. 3 to 6.

A region of the substrate 100, in which the organic layer 120 is to be formed is surrounded by the insulating layer 150. The insulating layer 150 is formed to include, for example, a photosensitive material such as polyimide. The insulating layer is formed through exposure and developing processes, so as to have a predetermined shape. The insulating layer 150 is formed after the first electrode 110 is formed and before the organic layer 120 is formed. However, the insulating layer. 150 may not be formed.

The organic layer 120 is formed on an inner side of the region surrounded by the insulating layer 150. The configuration of the organic, layer 120 is as described in the embodiment or the modification example. The second electrode 130 is formed on the organic layer 120. A portion of the second electrode 130 extends to above the second terminal 132 over the insulating layer 150.

The sealing structure 200 is formed on the surface of the substrate 100, on which the light emitting unit 140 is formed. However, the sealing structure 200 does not cover the first terminal 112 and the second terminal 132.

In Example 1, the sealing structure 200 has a structure described in the embodiment or the modification example. Therefore, in the light emitting device 10 as a lighting device, it is possible to bury defects occurring in the first inorganic film 210 of the sealing structure 200 by the first resin-containing film 230 and to reduce stress generated in the sealing structure 200.

Example 2

Figure 7:
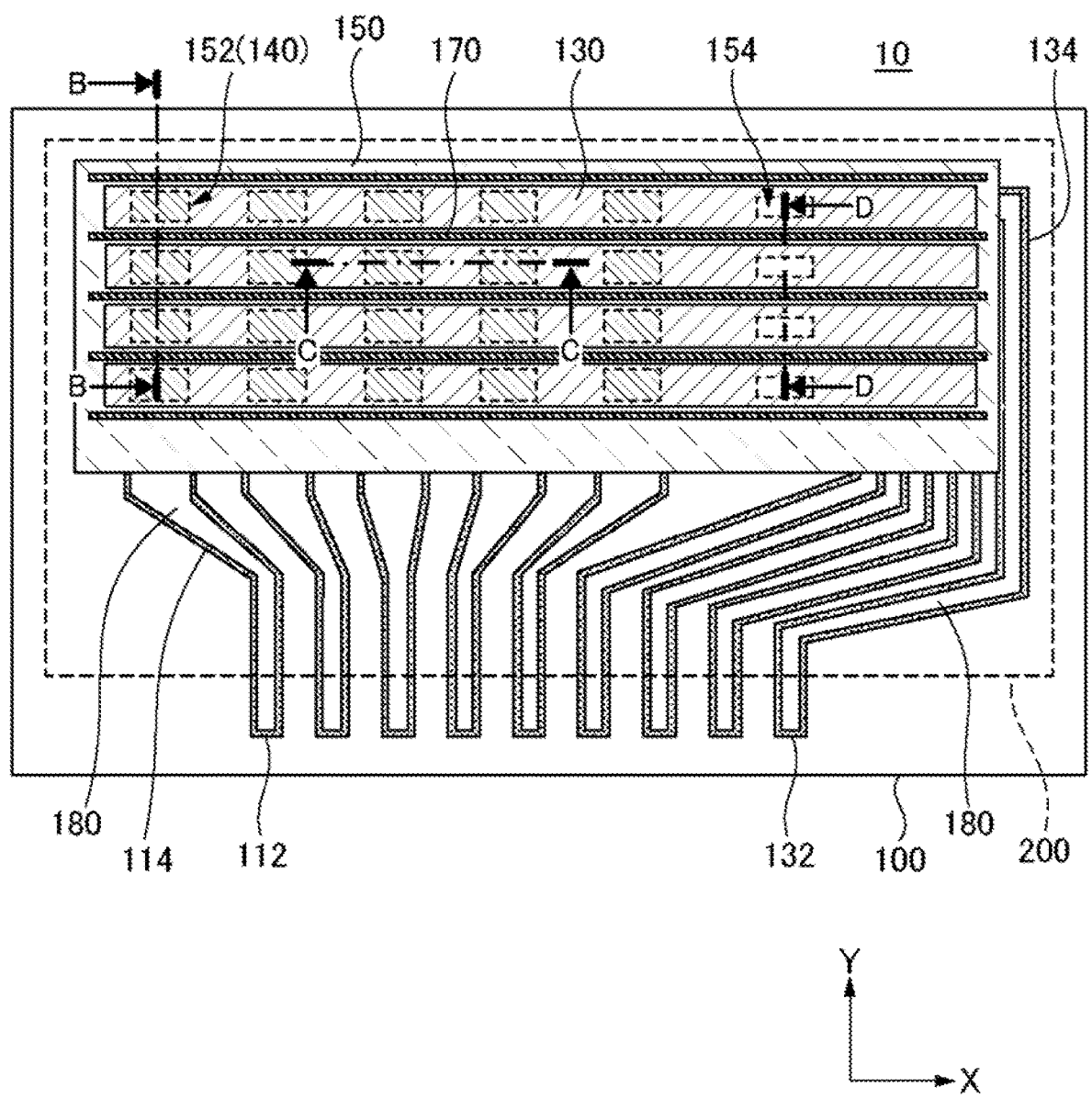
FIG. 7 is a plan view illustrating a light emitting device according to Example 2.
Figure 8:
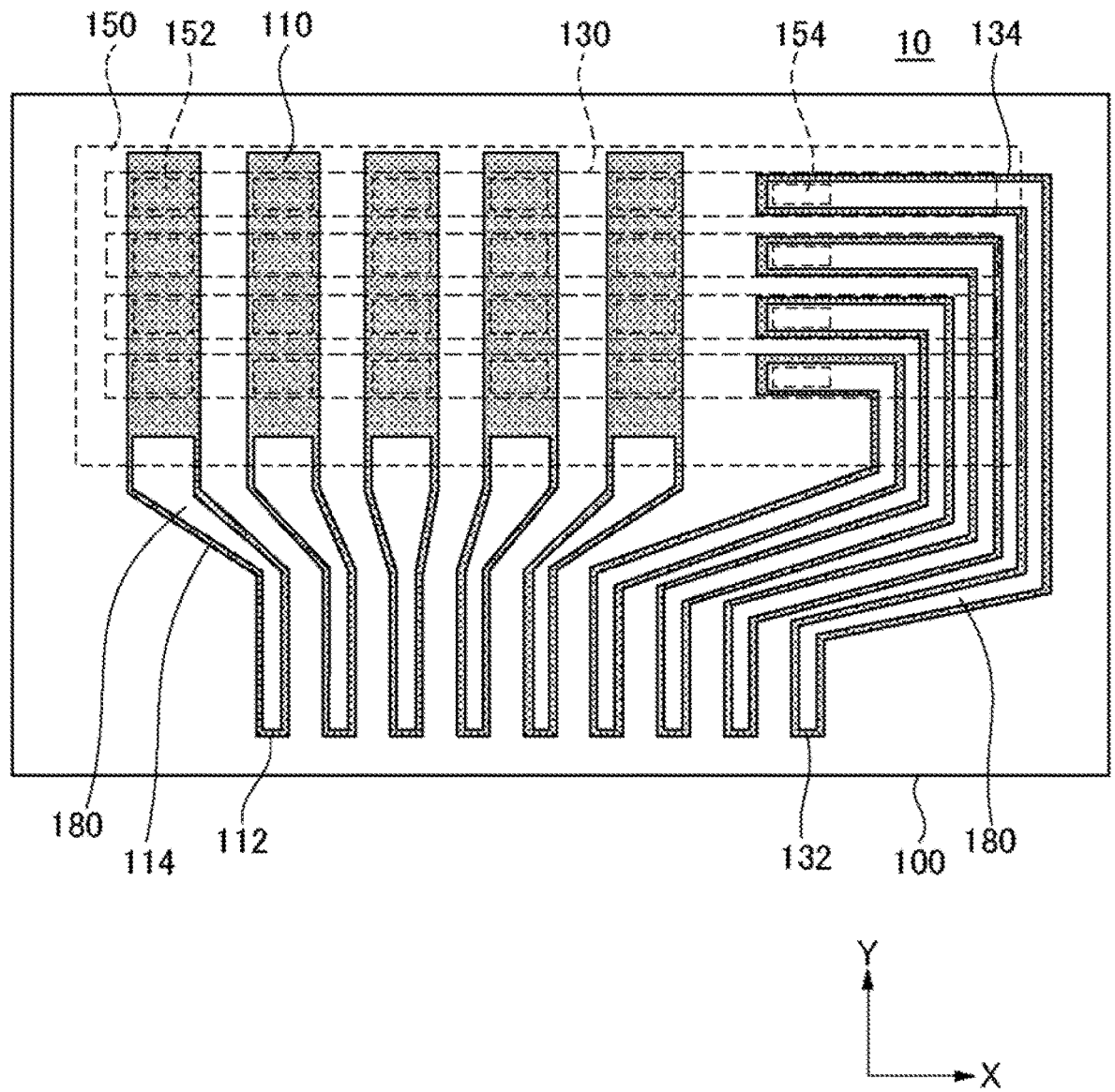
FIG. 8 is a view in which a partition wall, the second electrode, the organic layer, and the insulating layer are removed from FIG. 7.
Figure 9:
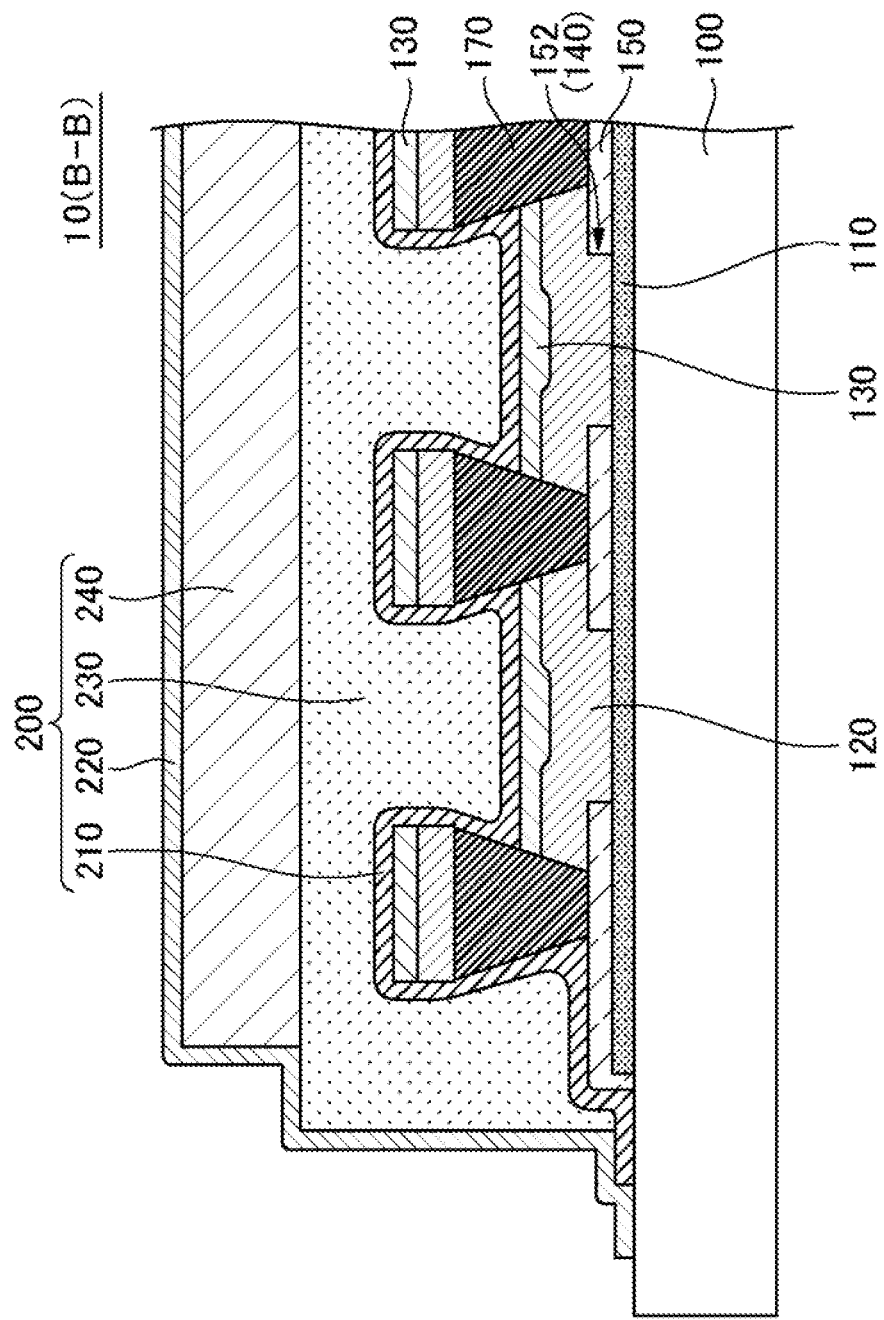
FIG. 9 is a sectional view taken along line B-B in FIG. 7.
Figure 10:
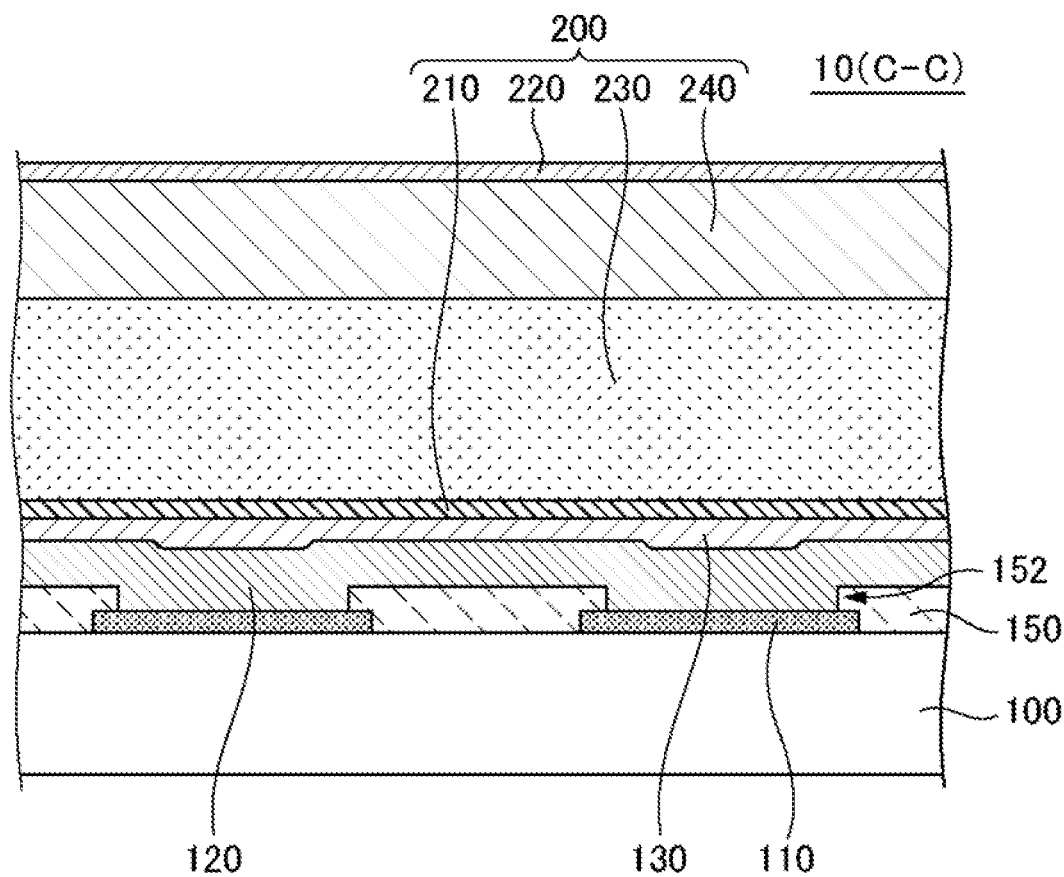
FIG. 10 is a sectional view taken along line C-C in FIG. 7.
Figure 11:
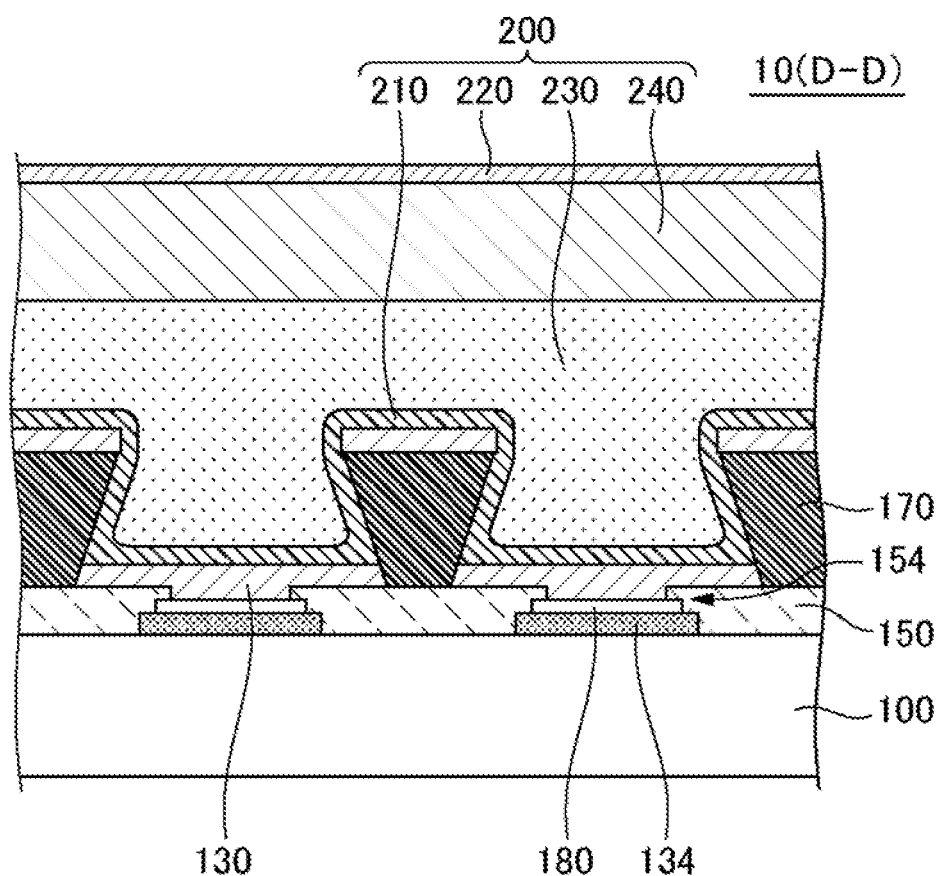
FIG. 11 is a sectional view taken along line D-D in FIG. 7.

FIG. 7 is a plan view illustrating a light emitting device 10 according to Example 2. FIG. 8 is a view in which a partition wall 170, the second electrode 130, the organic layer 120, and the insulating layer 150 are removed from FIG. 7. FIG. 9 is a sectional view taken along line B-B in FIG. 7. FIG. 10 is a sectional view taken along line C-C in FIG. 7. FIG. 11 is a sectional view taken along line D-D in FIG. 7.

The light emitting device 10 according to Example 2 is a display. The light emitting device 10 includes the substrate 100, the first electrode 110, the light emitting unit 140, the insulating layer 150, a plurality of openings 152, a plurality of openings 154, a plurality of lead wires 114, the organic layer 120, the second electrode 130, a plurality of lead wires 134, and a plurality of partition walls 170.

The first electrode 110 extends in a first direction (Y-direction in FIG. 7) to have a line shape. The end portion of the first electrode 110 is connected to the lead wire 114.

The lead wire 114 is a wire for connecting the first electrode 110 to the first terminal 112. In the example illustrated in FIGS. 7 to 11, one end side of the lead wire 114 is connected to the first electrode 110, and the other end side of the lead wire 114 servers as the first terminal 112. In the example illustrated in FIGS. 7 to 11, the first electrode 110 and the lead wire 114 are integrated with each other. A conductive layer 130 is formed on the first terminal 112 and on the lead wire 114. The conductive layer 180 is formed by using a metal having resistance lower than that of the first electrode 110, for example, Al or Ag. A port ion of the lead wire 114 is covered by the insulating layer 150.

As illustrated in FIGS. 7 and 9 to 11, the insulating layer 150 is formed on a plurality of first electrodes 110 and in regions between the first electrodes. The plurality of openings 152 and the plurality of openings 154 are formed in the insulating layer 150. A plurality of second electrodes 130 extends parallel to each other in a direction intersecting the first electrode 110 (for example, direction orthogonal to the first electrode: x-direction in FIG. 7). Partition walls 170 which will be described later in detail extend between the plurality of second electrodes 130. The opening 152 is positioned at an intersection point between the first electrode 110 and the second electrode 130 in plan view. The plurality of openings 152 is arranged to form a matrix.

The opening 154 is positioned in a region in which the insulating layer overlaps one end side of each of the plurality of second electrodes 130 in plan view. The openings 154 are arranged along one side of the matrix configured by the openings 152. When viewed from a direction along the one side (for example, a Y-direction in FIG. 7, that is, the direction along the first electrode 110), the openings 154 are arranged at a predetermined interval. A portion of the lead wire 134 is exposed from the opening 154. The lead wire 134 is connected to the second electrode 130 through the opening 154.

The lead wire 134 is a wire for connecting the second electrode 130 to the second terminal 132. The lead wire 134 includes a layer formed of the same material as that of the first, electrode 110. One end side of the lead wire 134 is positioned under the opening 154. The other end side of the lead wire 134 is drawn to the outside of the insulating layer 150. In the example illustrated in FIGS. 7 to 11, the other end side of the lead wire 134 serves as the second terminal 132. The conductive layer 180 is formed on the second terminal 132 and on the lead wire 134. A portion of the lead wire 134 is covered by the insulating layer 150.

The organic layer 120 is formed in a region overlapping the opening 152. The light emitting unit 140 is positioned in each of regions overlapping the openings 152.

In the example illustrated in FIGS. 9 and 10, a case where any of each layer constituting the organic layer 120 is exposed to the outside of the opening 152 is described. As illustrated in FIG. 10, the organic layer 120 may or may not be continuously formed even between the openings 152 which are adjacent to each other in the extending direction of the partition walls 170. However, as illustrated in FIG. 11, the organic layer 120 is not formed in the opening 154.

As illustrated in FIGS. 7 and 9 to 11, the second electrode 130 extends in a second direction intersecting the first direction (X-direction in FIG. 7). The partition wall 170 is formed between the second electrodes 130 which are adjacent to each other. The partition wall 170 extends in the second direction to be parallel to the second electrode 130. The foundation of the partition wall 170 is, for example, the insulating layer 150. The partition wall 170 is, for example, a photosensitive resin such as polyimide. The partition wall is formed by being exposed and developed, so as to have a desired pattern. The partition wall 170 may be composed of resins other than a polyimide-based resin, for example, an epoxy-based resin, an acryl-based resin, or an inorganic material such as silicon dioxide.

The partition wall 170 has an upside-down trapezoidal cross section (inverted trapezoid). That is, the width of the upper surface of the partition wall 170 is greater than the width of the lower surface of the partition wall 170. Therefore, when the partition wall 170 is formed before the second electrode 130 is formed, it is possible to form the plurality of second electrodes 130 all together by forming the second electrode 130 on the one surface side of the substrate 100 using a vapor deposition method or a sputtering method. The partition wall 170 also has a function of cutting the organic layer 120.

The sealing structure 200 is formed over the surface of the substrate 100, on which the light emitting unit 140 is formed.

Next, a manufacturing method of the light emitting device 10 in Example 2 will be described. First, the first electrode 110 and the lead wires 114 and 134 are formed on the first surface 102 of the substrate 100. The method of forming the above components is similar to the method of forming the first electrode 110 in the embodiment.

Then, the conductive layer 180 is formed on the lead wire 114, on the first terminal 112, on the lead wire 134, and on the second terminal 132. Then, the insulating layer 150 is formed and the partition wall 170 is formed. Then, the organic layer 120 and the second electrode 130 are formed. The sealing structure 200 is formed over the surface of the substrate 100, on which the light emitting unit 140 is formed.

In Example 2, the sealing structure 200 has a structure described in the embodiment or the modification example. Therefore, in the light emitting device 10 as a display, it is possible to bury defects occurring in the first inorganic film 210 of the sealing structure 200 by the first resin-containing film 230 and to reduce stress generated in the sealing structure 200.

Hitherto, the embodiment, the modification example, and the examples are described with reference to the drawings. However, these are just an example of the present invention, and various configurations other than the above descriptions can be employed.

This application claims priority based on Japanese Patent Application No. 2016-043754 filed on Mar. 7, 2016, the disclosure of which is incorporated herein by its entirety.

The invention claimed is:

1. A sealing structure that seals an object to be sealed, the structure comprising:
    a first inorganic film;

a first resin-containing film which is in contact with the first inorganic film and comprises a first resin;

a second inorganic film which is positioned on a side opposite to the first inorganic film with the first resin-containing film interposed between the first and second inorganic films;

a second resin-containing film which is positioned between the first resin-containing film and the second inorganic film, is in contact with the first resin-containing film and the second inorganic film, and comprises a second resin; and wherein the first inorganic film has a recessed portion or a hole positioned on a surface side of the first inorganic film opposite to the object to be sealed, and a portion of the first resin-containing film is positioned in the recessed portion or the hole.

2. The sealing structure according to claim 1, wherein the first resin-containing film is thicker than the first inorganic film.

3. The sealing structure according to claim 1, wherein the second inorganic film is formed by using a material that is the same as a material of the first inorganic film.

4. The sealing structure according to claim 1, wherein the first inorganic film is positioned to be closer to the object to be sealed than the second inorganic film in a thickness direction.

5. The sealing structure according to claim 1, wherein at least a portion of the first inorganic film overlaps neither the first resin-containing film nor the second resin-containing film, and at least a portion of the second inorganic film overlaps neither the first resin-containing film nor the second resin-containing film and is in contact with the first inorganic film.

6. The sealing structure according to claim 1, wherein at least a portion of the first resin-containing film does not overlap the second resin-containing film and is in contact with the second inorganic film.

7. The sealing structure according to claim 1, wherein an end of the first resin-containing film overlaps an end of the second resin-containing film.

8. The sealing structure according to claim 1, wherein a Young's modulus of the second resin is lower than a Young's modulus of the first resin.

9. The sealing structure according to claim 1, wherein a glass transition point of the second resin is higher than a glass transition point of the first resin.

10. A light emitting device comprising:
a light emitting unit comprising an organic layer; and
a sealing structure that seals the light emitting unit,
wherein the sealing structure is the sealing structure according to claim 1.

* * * * *